United States Patent
Mizutani

(10) Patent No.: US 9,633,945 B1
(45) Date of Patent: Apr. 25, 2017

(54) SEMICONDUCTOR DEVICE AND METHOD OF MANUFACTURING SEMICONDUCTOR DEVICE

(71) Applicant: Kabushiki Kaisha Toshiba, Minato-ku (JP)

(72) Inventor: Takuya Mizutani, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/171,151

(22) Filed: Jun. 2, 2016

Related U.S. Application Data

(60) Provisional application No. 62/287,597, filed on Jan. 27, 2016.

(51) Int. Cl.

| | |
|---|---|
| *H01L 23/485* | (2006.01) |
| *H01L 23/528* | (2006.01) |
| *H01L 27/1157* | (2017.01) |
| *H01L 27/11582* | (2017.01) |
| *H01L 23/522* | (2006.01) |
| *H01L 21/768* | (2006.01) |
| *H01L 23/538* | (2006.01) |
| *H01L 25/065* | (2006.01) |

(52) U.S. Cl.
CPC .... *H01L 23/5283* (2013.01); *H01L 21/76816* (2013.01); *H01L 21/76877* (2013.01); *H01L 23/5226* (2013.01); *H01L 27/1157* (2013.01); *H01L 27/11582* (2013.01); *H01L 23/4855* (2013.01); *H01L 23/5386* (2013.01); *H01L 25/0657* (2013.01)

(58) Field of Classification Search
CPC ............. H01L 23/4855; H01L 25/0657; H01L 23/5226; H01L 23/5386
USPC ........................................................ 257/773
See application file for complete search history.

(56) References Cited

U.S. PATENT DOCUMENTS

| | | | |
|---|---|---|---|
| 8,912,593 | B2 | 12/2014 | Matsuda |
| 9,029,938 | B2 | 5/2015 | Nakaki |
| 9,184,177 | B2 | 11/2015 | Imamura et al. |
| 9,406,609 | B1 * | 8/2016 | Lung ................ H01L 21/76816 |

(Continued)

FOREIGN PATENT DOCUMENTS

| | | |
|---|---|---|
| JP | 2011-222994 | 11/2011 |
| JP | 2013-258360 | 12/2013 |

(Continued)

*Primary Examiner* — George Fourson, III

(74) *Attorney, Agent, or Firm* — Oblon, McClelland, Maier & Neustadt, L.L.P.

(57) ABSTRACT

According to one embodiment, there is provided a semiconductor device, which includes an electrode lead-out part, a planarization film, contacts, and first and second columnar patterns. The electrode lead-out part is arranged such that an electrode film and an insulating film are alternately stacked in a plurality of layers, and layers of the electrode film are arranged stepwise. The planarization film is arranged above the electrode lead-out part. The first columnar pattern extends from a lowermost portion of the electrode lead-out part to a position lower than the upper side of the planarization film by a first depth. The second columnar pattern extends from a lowermost portion of the electrode lead-out part to a position lower than the upper side of the planarization film by a second depth larger than the first depth.

10 Claims, 19 Drawing Sheets

(56) References Cited

U.S. PATENT DOCUMENTS

| | | |
|---|---|---|
| 2011/0244666 A1 | 10/2011 | Kim et al. |
| 2014/0197546 A1 | 7/2014 | Hwang et al. |
| 2015/0214103 A1 | 7/2015 | Matsuda |
| 2015/0221667 A1 | 8/2015 | Fukuzumi et al. |
| 2015/0262932 A1* | 9/2015 | Yamane ............ H01L 27/11582 257/314 |
| 2016/0172296 A1* | 6/2016 | Lim ...................... H01L 23/485 257/773 |
| 2016/0293539 A1* | 10/2016 | Park .................. H01L 27/11556 |
| 2016/0307632 A1* | 10/2016 | Lee ........................ G11C 16/14 |

FOREIGN PATENT DOCUMENTS

| | | |
|---|---|---|
| JP | 2014-138188 | 7/2014 |
| JP | 2015-56452 | 3/2015 |
| JP | 2015-138941 | 7/2015 |
| JP | 2015-149413 | 8/2015 |
| JP | 2015-170692 | 9/2015 |

\* cited by examiner

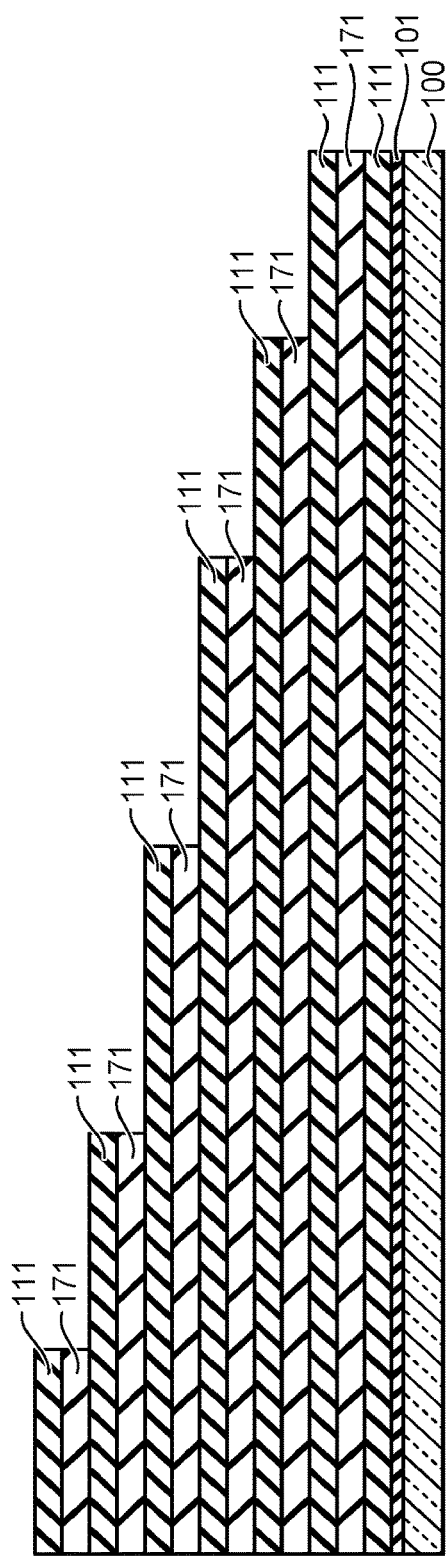

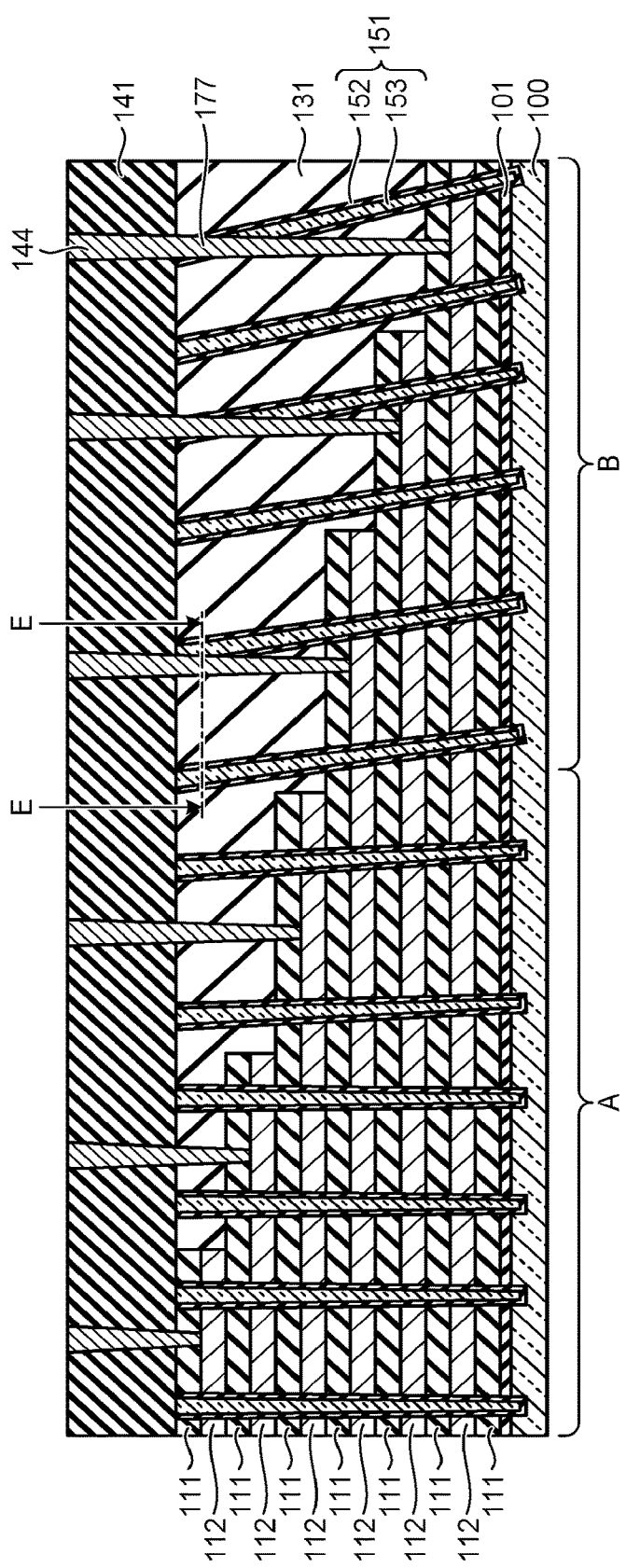

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from U.S. Provisional Application No. 62/287,597, filed on Jan. 27, 2016; the entire contents of which are incorporated herein by reference.

FIELD

Embodiments described herein relate generally to a semiconductor device and a method of manufacturing a semiconductor device.

BACKGROUND

In recent years, NAND type flash memories having a two-dimensional structure are confronting the limit of scaling. Under the circumstances, there have increased the demands for a vertical type nonvolatile memory technique that can realize a larger memory capacity by use of integration based on stacking of layers without depending on scaling, and so a nonvolatile memory device having a vertical NAND structure, in which NAND strings are vertically arranged, has been proposed. For the nonvolatile memory device having a vertical NAND structure, a process technique is used such that it performs formation of word lines (control gate electrodes) stacked as layers, and formation of a stepwise lead-out part for leading out electrodes from the word lines.

In general, a metal material having a resistivity lower than poly-silicon is used for word lines. However, it is difficult to perform high aspect etching all together to a layered body composed of oxide films and metal films. In consideration of this problem, there is used a technique called replacement, which includes etching a layered body composed of oxide films and sacrificial films, then removing the sacrificial films, and then embedding a metal material into the gap spaces formed by removing the sacrificial films. In this case, columnar patterns are formed in the stepwise lead-out part before the replacement so that they can support the oxide films to prevent them from collapsing. The columnar patterns are vertically formed on the semiconductor substrate.

However, a film stress acts on the columnar patterns during the replacement, and causes the columnar patterns to be inclined, as the case may be. As a result, there may be a case that the columnar patterns thus inclined come into contact with contact patterns present adjacent to the word lines and formed to connect with the word lines. In the case that the columnar patterns include a conductive film, if the columnar patterns and the contact patterns come into contact with each other, a leakage current flowing through the columnar patterns into the silicon substrate is generated.

BRIEF DESCRIPTION OF THE DRAWINGS

FIGS. 4A to 4K are sectional views showing an example of the sequence of a method of manufacturing the semiconductor device according to the first embodiment;

FIGS. 6A and 6B are sectional views showing an example of the sequence of a method of manufacturing a contact part according to a comparative example;

DETAILED DESCRIPTION

In general, according to one embodiment, there is provided a semiconductor device, which includes an electrode lead-out part, a planarization film, contacts, and a plurality of columnar patterns. The electrode lead-out part is arranged such that an electrode film and a first insulating film are alternately stacked in a plurality of layers above a substrate, and layers of the electrode film are arranged stepwise to be longer gradually toward a lower side. The planarization film includes a second insulating film and is arranged above the electrode lead-out part. The contacts are made of a conductive material and extending from an upper side of the planarization film to the layers of the electrode film, respectively. The columnar patterns are arranged in the electrode lead-out part. The plurality of columnar patterns include a first columnar pattern and a second columnar pattern. The first columnar pattern extends from a lowermost portion of the electrode lead-out part to a position lower than the upper side of the planarization film by a first depth. The second columnar pattern extends from a lowermost portion of the electrode lead-out part to a position lower than the upper side of the planarization film by a second depth larger than the first depth.

Exemplary embodiments of a semiconductor device and a method of manufacturing a semiconductor device will be explained below in detail with reference to the accompanying drawings. The present invention is not limited to the following embodiments. The sectional views, and top views of a semiconductor device used in the following embodiments are schematic, and so the relationship between the thickness and width of each layer and/or the thickness ratios between respective layers may be different from actual states.

First Embodiment

In the following embodiment, a semiconductor device is exemplified by a nonvolatile semiconductor memory device having a structure in which a plurality of memory cells (transistors) of the SGT (Surrounding Gate Transistor) type are arranged in the height direction. The SGT type memory cell includes a semiconductor film serving as a channel and formed as a vertical column on a substrate, and a gate electrode film formed on the lateral surface of the semiconductor film, through a tunnel insulating film, a charge accumulation film, and an inter-electrode insulating film.

Figure 1:
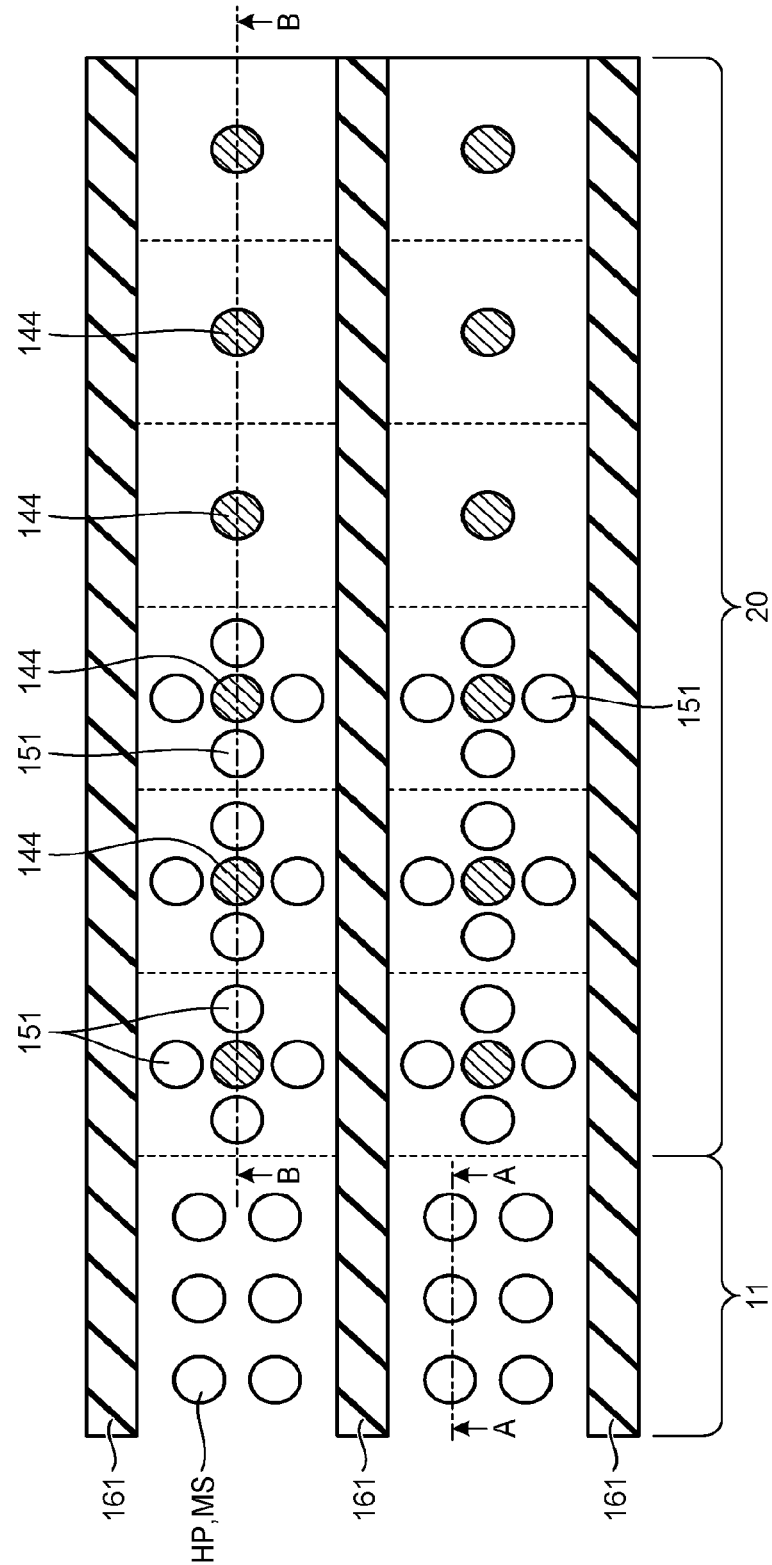
FIG. 1 is a top view schematically showing an example of an arrangement state in association with memory strings of a memory cell part and contacts of a word line contact part in a semiconductor device according to a first embodiment.
Figure 2:
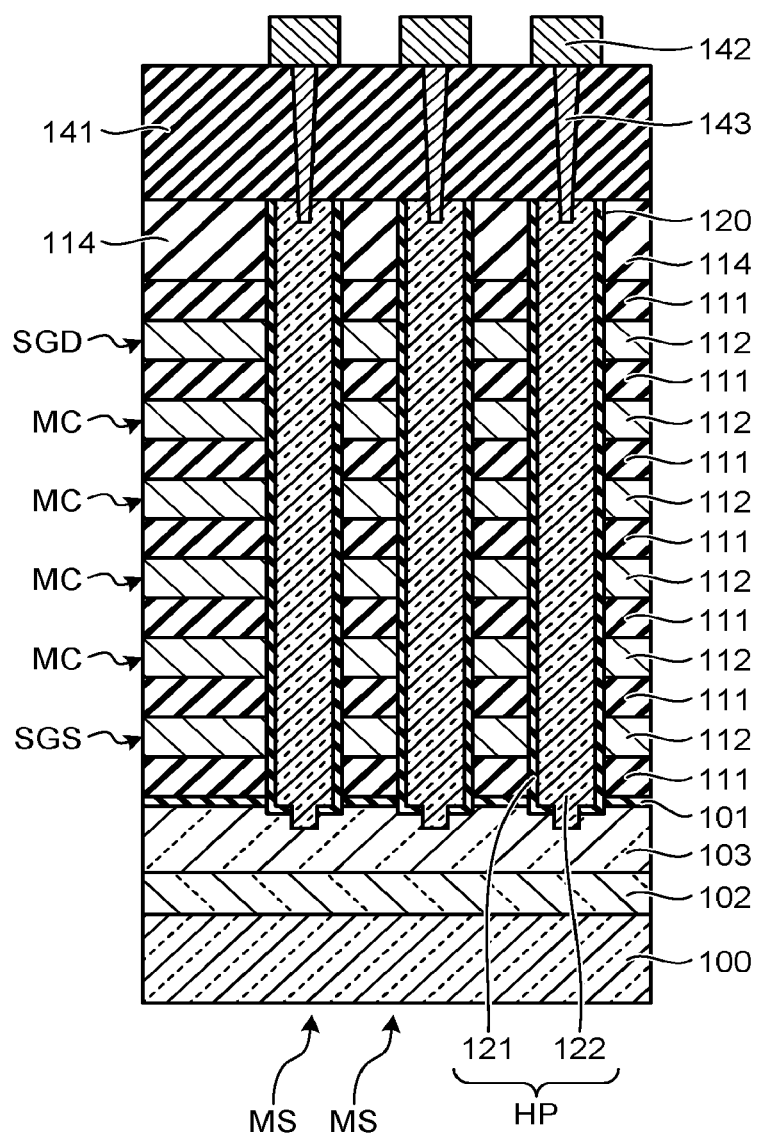
FIG. 2 is a sectional view schematically showing a structural example in a direction parallel with word lines in the memory cell part of the semiconductor device.
Figure 3:
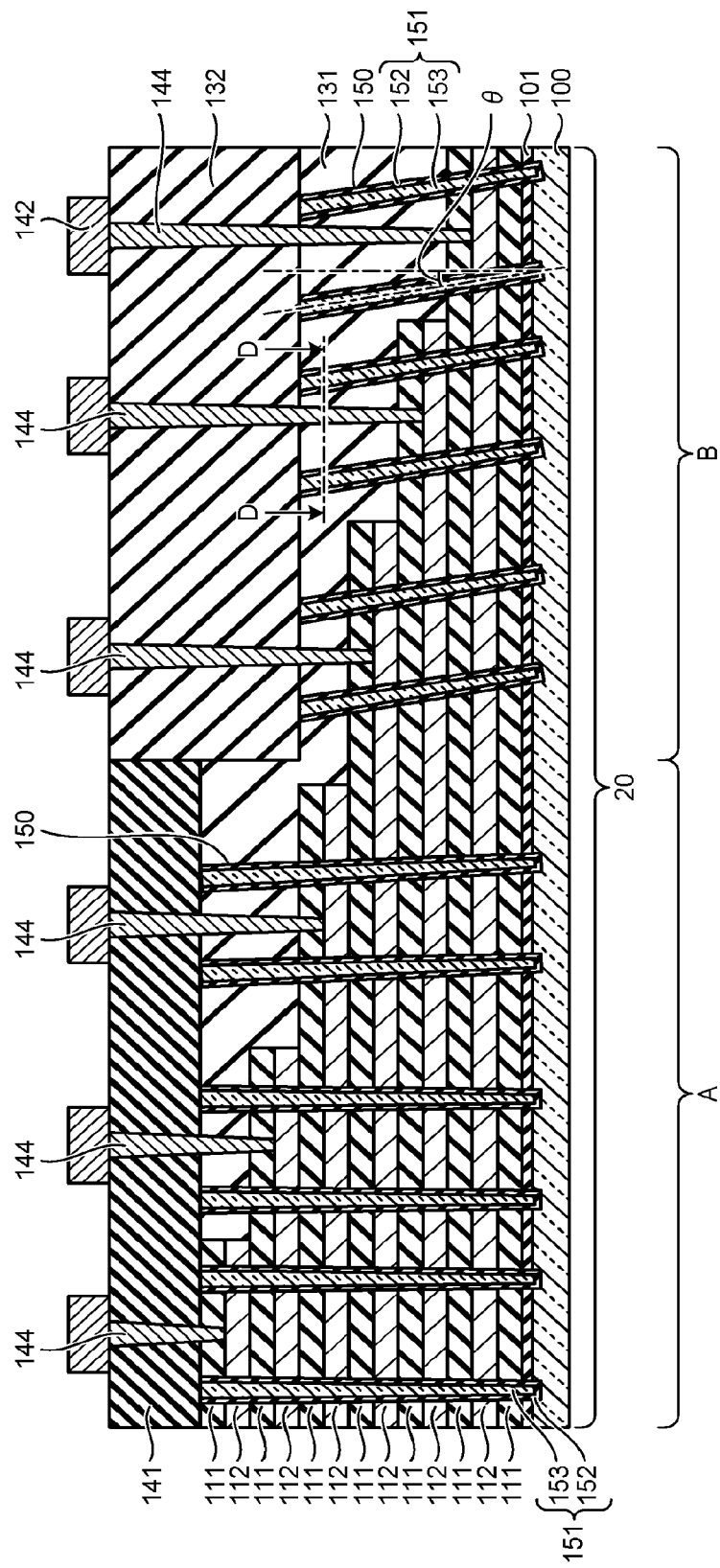
FIG. 3 is a sectional view schematically showing a structural example in a direction parallel with word lines in the word line contact part of the semiconductor device according to the first embodiment.

FIG. 1 is a top view schematically showing an example of an arrangement state in association with memory strings of a memory cell part and contacts of a word line contact part in a semiconductor device according to a first embodiment. FIG. 2 is a sectional view schematically showing a structural example in a direction parallel with word lines in the memory cell part of the semiconductor device. FIG. 3 is a sectional view schematically showing a structural example in a direction parallel with word lines in the word line contact part of the semiconductor device according to the first embodiment. Here, FIG. 1 is a view, seen from the top, of a portion cut by a plane parallel with the substrate surface at a position where a drain-side selection transistor is formed. Further, FIG. 2 corresponds to a sectional view taken along a line A-A in FIG. 1, and FIG. 3 corresponds to a sectional view taken along a line B-B in FIG. 1.

The semiconductor device includes a memory cell part 11 and a word line contact part 20. In the memory cell part 11, memory strings MS are formed almost vertically and arranged in a two-dimensional state on a semiconductor substrate 100. Each of the memory strings MS has a configuration in which a plurality of transistors are connected in series. The memory string MS includes a pillar member HP and electrode films 112. The pillar member HP has a structure in which an insulating film 121 having a hollow columnar shape is stacked on the outer peripheral surface of a semiconductor film 122 having a columnar shape. The columnar semiconductor film 122 serves as the channels of the transistors constituting the memory string MS. As the semiconductor film 122, for example, a poly-silicon film prepared by annealing amorphous silicon may be used. As the insulating film 121, an ONO film, which constitutes a tunnel insulating film, a charge accumulation film, and an inter-electrode insulating film, may be used. Further, the insulating film 121 may be made of a material containing any one element of oxygen O, nitrogen N, and aluminum Al. A plurality of electrode films 112 are arranged with spacer films 111 respectively interposed therebetween in the height direction of the pillar member HP. Each of the spacer films 111 is formed of an insulating film, such as a silicon oxide film.

In the column of the transistors connected in series in the height direction, the transistors at the upper and lower ends serve as selection transistors SGS and SGD. In the example shown in FIG. 2, the source-side selection transistor SGS is arranged on the lower side, and the drain-side selection transistor SGD is arranged on the upper side. Between these two selection transistors SGS and SGD, one or more memory cell transistors (each of which will be simply referred to as "memory cell" in some cases, hereinafter) are arranged at predetermined intervals. In this example, each of the selection transistors SGS and SGD has the same structure as the structure of each of the memory cell transistors MC.

The electrode films 112 of the memory cells MC serve as word lines, in which the electrode film 112 of the source-side selection transistor SGS serves as a source-side selection gate line, and the electrode film 112 of the drain-side selection transistor SGD serves as a drain-side selection gate line. Each of the word lines connects the control gate electrodes of memory cells MC at the same height to each other among memory strings MS present within a predetermined range. The source-side selection gate line connects the selection gate electrodes of source-side selection transistors SGS to each other among the memory strings MS present within the predetermined range, and the drain-side selection gate line connects the selection gate electrodes of drain-side selection transistors SGD to each other among the memory strings present within the predetermined range.

Here, in the memory cell part 11, a spacer film 111 and an electrode film 112 are alternately stacked each in a plurality of layers, and an insulating film 114 is further stacked on the uppermost side, so that a layered body is formed. Memory holes 120 are formed to penetrate this layered body from the top to the bottom, and the pillar members HP are respectively disposed in the memory holes 120. The layered body has a thickness of 4 μm to 7 μm, for example.

In the word line contact part 20, electrode films 112 extending from the memory cell part 11 are arranged in a stacked state. The electrode films 112 form a stepwise configuration such that the electrode films 112 on their lower sides are respectively exposed. The word line contact part 20 also has a structure in which spacer films 111 are respectively interposed between the electrode films 112 vertically adjacent to each other. Further, contacts 144 are formed and connected to the electrode films 112 at the respective heights.

In the word line contact part 20, an insulating film is formed on the stepwise electrode films 112. In an area A of the word line contact part 20, a first planarization film 131 and an interlayer insulating film 141 are stacked on the stepwise electrode films 112. On the other hand, in an area B of the word line contact part 20, the first planarization film 131 and a second planarization film 132 are stacked on the stepwise electrode films 112. As each of the first planarization film 131, the second planarization film 132, and the interlayer insulating film 141, for example, a silicon oxide film may be used.

In the word line contact part 20, columnar patterns 151 are formed. With respect to a layered body composed of sacrificial films and the spacer films 111 alternately stacked, the columnar patterns 151 will serve to support the spacer films 111 so that gap spaces generated by removing the sacrificial films can be kept during a process of manufacturing the semiconductor device as described later. For example, as shown in FIG. 1, columnar patterns 151 are arranged at positions adjacent to each of the contacts 144 in a direction parallel with the word lines and at positions adjacent to this contact 144 in a direction perpendicular to the word lines. Further, in a region where columnar patterns 151 are formed with inclination angles larger than a predetermined angle, the first planarization film 131 and the columnar patterns 151 are partly removed to a predetermined depth, and the second planarization film 132 is disposed in the space formed by the removal. Here, the columnar patterns 151 are not limited to the arrangement state shown in FIG. 1. The columnar patterns 151 may be arranged at any arbitrary positions.

The columnar patterns 151 are respectively disposed in columnar pattern formation holes 150 formed in the first planarization film 131. The lower ends of the columnar patterns 151 reach the spacer film 111 on the lowermost side. Each of the columnar patterns 151 has a structure in which an insulating film 152 having a hollow columnar shape is stacked on the outer peripheral surface of a semiconductor film 153 having a columnar shape. As the semiconductor film 153, for example, a poly-silicon film prepared by annealing amorphous silicon may be used. As the insulating film 152, an ONO film, which constitutes a tunnel insulating film, a charge accumulation film, and an inter-electrode insulating film, may be used. Each of the columnar patterns 151 has a size (diameter) of 70 nm to 300 nm, for example, in a direction parallel with the substrate surface.

The columnar patterns 151 are inclined due to a stress generated when the sacrificial films are removed, a stress generated by deflection of the spacer films 111 after the sacrificial films are removed, and a stress generated by the electrode films 112. As shown in FIG. 3, as the number of layers of the electrode film 112 in contact therewith is smaller, the columnar patterns 151 tend to be more inclined. This is caused by the difference between a stress received from the first planarization film 131 and a stress received due to shrinkage of the electrode films 112.

According to the first embodiment, in the area B including columnar patterns 151 such that the inclinations of these columnar patterns 151 are equal to or larger than a predetermined angle, the first planarization film 131 and the columnar patterns 151 are partly removed to a predetermined depth from the upper surface of the first planarization film 131, and the second planarization film 132 is disposed in the space formed by the removal. With this arrangement, such a probability is reduced that columnar patterns 151 thus inclined come into contact with contacts 144. On the other hand, in the area A including columnar patterns 151 such that the inclinations of these columnar patterns 151 are less than the predetermined angle, the first planarization film 131 and the columnar patterns 151 are not removed. Accordingly, the columnar patterns 151 are present in the word line contact part 20, as two types having different heights. Further, the predetermined angle is preferably set to be not less than 0° but less than 4°. Here, the inclination angle of each of the columnar patterns 151 is defined by an inclination θ of the columnar pattern 151 relative to a line perpendicular to the main surface of the semiconductor substrate 100, as shown in FIG. 3.

As shown in FIG. 1, in the memory cell part 11 and the word line contact part 20, dividing parts 161 extending in a direction parallel with the word line direction are arranged at predetermined intervals in a direction perpendicular to the word line direction. Each of the dividing parts 161 has a configuration in which an insulating film, such as a silicon oxide film, is embedded in a slit that penetrates, from the top to the bottom, the layered body composed of the spacer films 111 and the electrode films 112 stacked each other. The memory cell part 11 and the word line contact part 20 are formed by use of the regions between adjacent dividing parts 161.

Here, the slits, in which the dividing parts 161 are to be embedded, will serve as windows through which a material for forming the electrode films 112 can move in and out, when the electrode films 112 are formed in gap spaces generated by removing the sacrificial films, during a process of manufacturing the semiconductor device as described later. The electrode films 112 will be formed through the slits in the memory cell part 11 and the word line contact part 20.

A wiring layer 142 is formed on the memory strings MS in the memory cell part 11 through the interlayer insulating film 141, and is formed in the word line contact part 20 through the interlayer insulating film 141 or second planarization film 132. The wiring layer 142 is patterned in a predetermined shape. Here, as the wiring layer 142, tungsten (W), aluminum (Al), or copper (Cu) is used.

In the memory cell part 11, contacts 143 are disposed in the interlayer insulating film 141 to respectively connect the upper ends of the memory strings MS to portions of the wiring layer 142. Further, in the word line contact part 20, the contacts 144 are disposed in the interlayer insulating film 141, the first planarization film 131, and the second planarization film 132 to connect the electrode films 112 at respective levels to portions of the wiring layer 142.

In the formation region of the memory cell part 11 and the word line contact part 20, an N-type well 102 is formed in the upper surface of the semiconductor substrate 100, and a P-type well 103 is further formed in the N-type well 102. Further, on the upper surface of the semiconductor substrate 100, an insulating film 101 is formed to be used as a gate insulating film of field effect transistors (not shown) disposed in a peripheral circuit part. Other than the components described above, the semiconductor substrate 100 is provided with a peripheral circuit and so forth. The peripheral circuit includes circuit elements, such as transistors, (not shown).

Figure 4A:
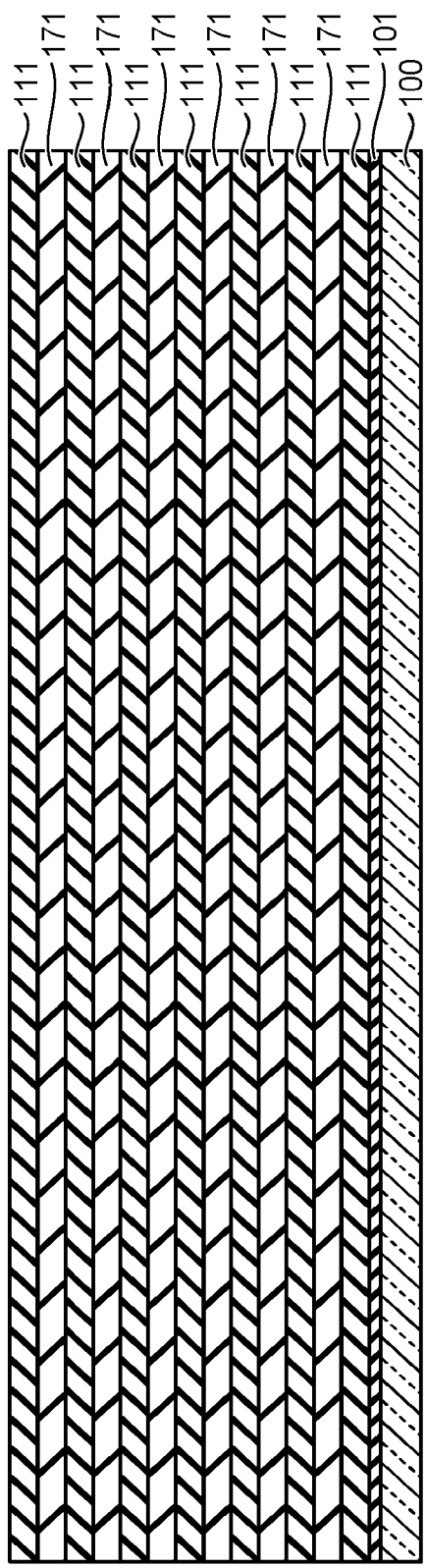

Next, an explanation will be given of a method of forming the word line contact part 20 having a stepwise configuration. FIGS. 4A to 4K are sectional views showing an example of the sequence of a method of manufacturing the semiconductor device according to the first embodiment. Here, the manufacturing method will be explained in relation to the word line contact part 20. At first, as shown in FIG. 4A, an insulating film 101, which is to be used as a gate insulating film of field effect transistors, is formed in a peripheral circuit part (not shown) on a semiconductor substrate 100, such as a silicon substrate. As the insulating film 101, for example, a silicon oxide film may be used. The insulating film 101 may be formed by use of a thermal oxidation method or the like. Then, a spacer film 111 and a sacrificial film 171 are alternately stacked each in a plurality of layers on the insulating film 101, so that a layered body is formed. Here, the uppermost layer of the layered body is formed of the spacer film 111.

Then, as shown in FIG. 4B, a stepwise lead-out structure is formed in the word line contact part 20. For example, the stepwise lead-out structure is formed such that the upper side of the layered body in the word line contact part 20 is masked by a resist, and etching is repeatedly performed to each set of the spacer film 111 and the sacrificial film 171, while the mask is thinned by side etching at every time of etching. However, the stepwise lead-out structure may be formed by use of another method such that a resist pattern formation process using lithography and an anisotropic etching process are repeated a plurality of times, while a plurality of photo masks are used in accordance with the number of layers of the sacrificial film 171.

Figure 4C:
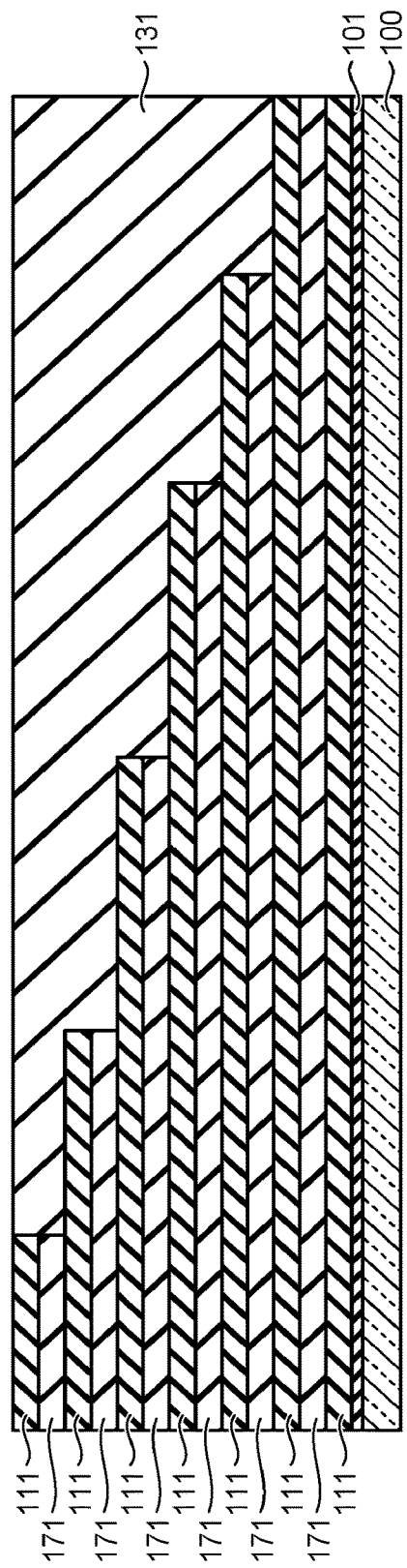

Thereafter, as shown in FIG. 4C, a first planarization film 131 is formed on the stepwise lead-out structure in the word line contact part 20. As the first planarization film 131, for example, a silicon oxide film may be used. The first planarization film 131 is formed to be higher than the upper surface of the spacer film 111 on the uppermost side. Thereafter, the part of the first planarization film 131 present above the upper surface of the spacer film 111 on the uppermost side is removed, and thereby the first planarization film 131 is planarized, by use of a CMP (Chemical Mechanical Polishing) method or the like.

Figure 4D:
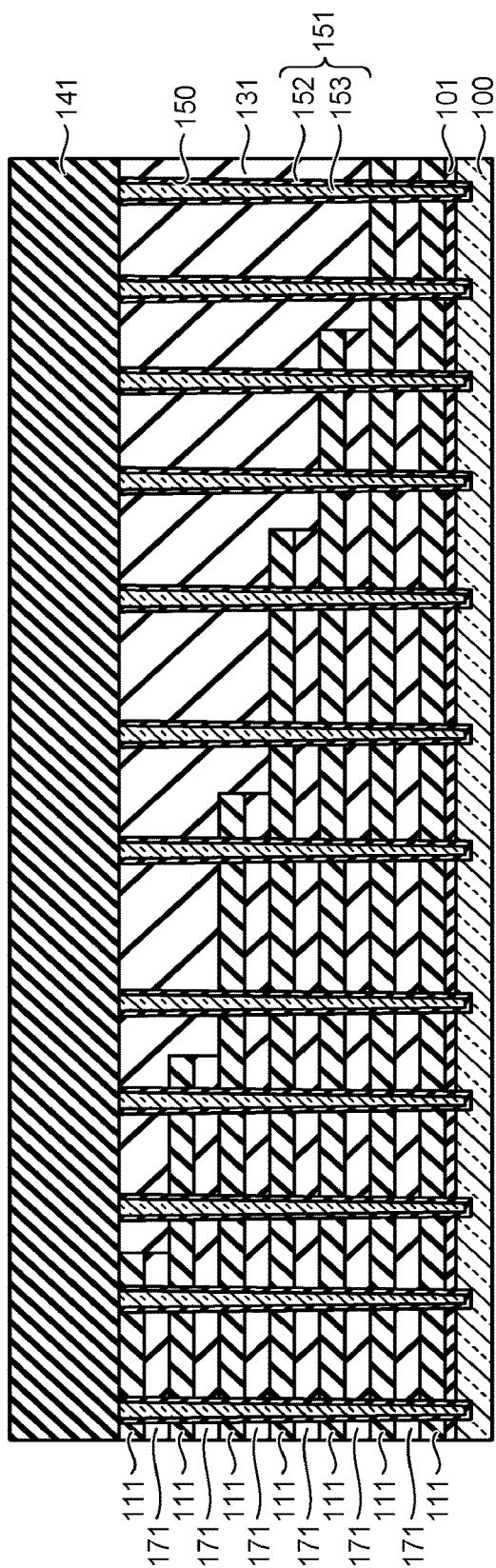

Then, as shown in FIG. 4D, columnar patterns 151 are formed in the word line contact part 20. More specifically, a resist is applied onto the word line contact part 20, and a columnar pattern formation mask is formed by use of a lithography technique. Then, columnar pattern formation holes 150 are formed in the stepwise lead-out structure by use of anisotropic etching, such as an RIE (Reactive Ion Etching) method. The columnar pattern formation holes 150 are formed to extend from the upper surface of the layered body (i.e., the upper surface of the spacer film 111 on the uppermost side or the upper surface of the first planarization film 131) and reach the upper side of the semiconductor substrate 100. Thereafter, on the sidewall of each of the columnar pattern formation holes 150, an insulating film 152 having a hollow columnar shape is formed. Subsequently, a semiconductor film 153 is formed at the center of each of the columnar pattern formation holes 150. Then, the part of the first planarization film 131 and the parts of the insulating film 152 and the semiconductor film 153 formed above the uppermost layer of the layered body are removed by use of a CMP method or the like. Consequently, the columnar patterns 151 are formed such that each of them is composed of the semiconductor film 153 having a columnar shape and the insulating film 152 that covers the lateral surface and the bottom surface of this columnar semiconductor film 153. Then, an interlayer insulating film 141 is formed on the first planarization film 131 formed with the columnar patterns 151. As the interlayer insulating film 141, for example, a silicon oxide film may be used.

Here, in the word line contact part 20, the columnar patterns 151 are formed in the columnar pattern formation holes 150, and, at this time, in the memory cell part 11, pillar members HP may be formed in memory holes 120 formed in the layered body. In this case, as the insulating film 152, an ONO film may be used. However, the columnar patterns 151 in the word line contact part 20 and the pillar members HP in the memory cell part 11 may be formed not at the same time but in different steps.

Then, slits are formed at positions (not shown) to extend in the word line direction at predetermined intervals in a direction perpendicular to the word line direction, by use of anisotropic etching. The slits are formed to extend through the layered body from the top to the bottom.

Figure 4E:
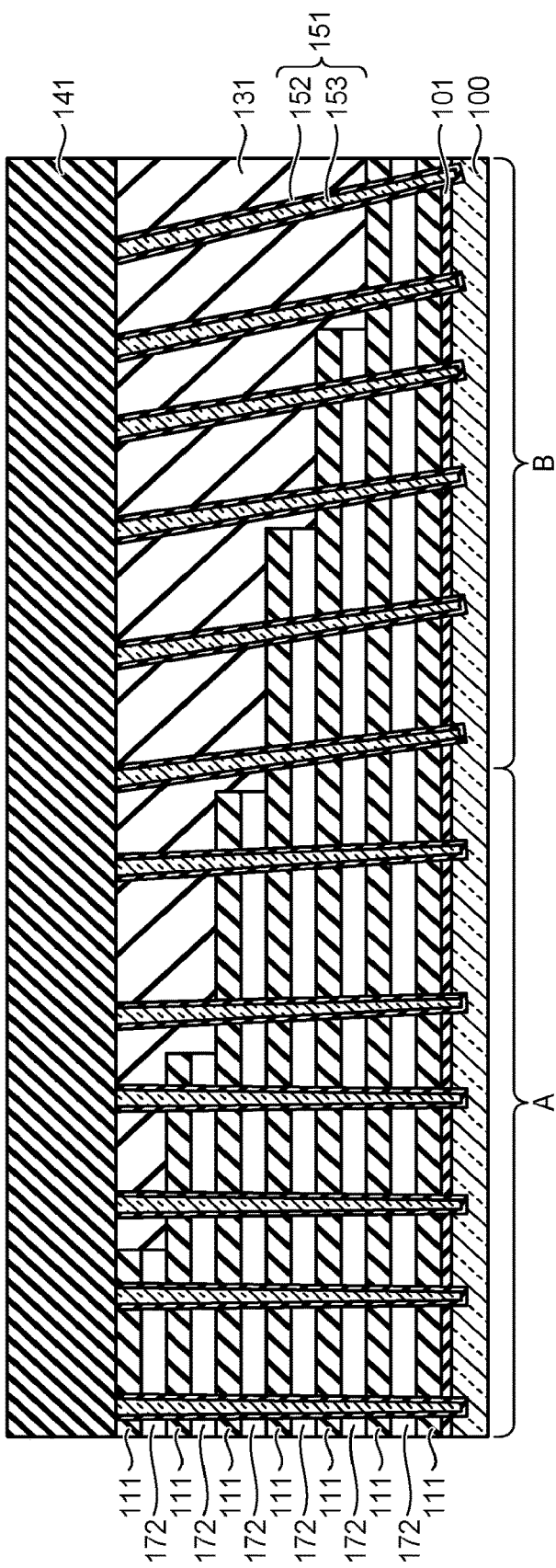

Thereafter, as shown in FIG. 4E, the sacrificial films 171 are removed. At this time, etching is performed by infiltrating an etchant through the slits to remove the sacrificial films 171. For example, wet etching using hot phosphoric acid, or dry etching, such as CDE (Chemical Dry Etching), is performed, so that the sacrificial films 171 are removed. Consequently, gap spaces 172 are formed at the positions where the sacrificial films 171 were present. As a result, a structure is provided such that the spacer films 111 are not collapsed but supported by the lateral surfaces of the columnar patterns 151 that stand relative to the semiconductor substrate 100. At this time, the etching is performed under conditions by which the selective ratio of the sacrificial films 171 relative to the spacer films 111 is set to be sufficiently large.

Figure 4F:
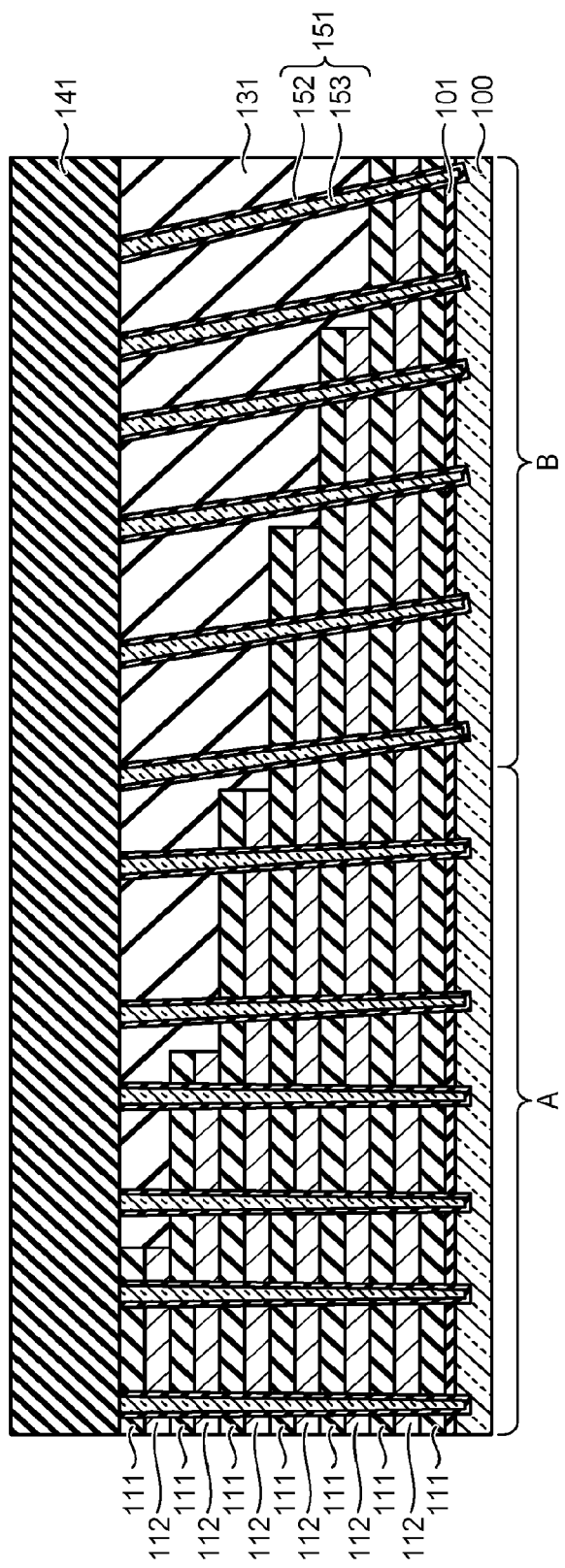

Then, as shown in FIG. 4F, electrode films 112 are formed in a conformal state by a film formation method, such as a CVD (Chemical Vapor Deposition) method, in the gap spaces 172 between the spacer films 111 in the vertical direction. More specifically, the electrode films 112 are formed to cover the surfaces of the spacer films 111 protruding in a direction parallel with the substrate surface, and to cover the lateral surfaces of the columnar patterns 151 in contact with the gap spaces 172. As the electrode films 112, W or the like may be used. The electrode films 112 can reach the gap spaces 172 between the spacer films 111 in the vertical direction, through the slits.

As shown in FIGS. 4E and 4F, the columnar patterns 151 in the area A are in a state where no or almost no inclination is generated thereon, but the columnar patterns 151 in the area B are in a state where an inclination is generated thereon. This indicates the fact that, because film stresses are generated between the spacer films 111 and the first planarization film 131 when the sacrificial films 171 are removed as shown in FIG. 4E, because deflection of the spacer films 111 is generated between adjacent columnar patterns 151, or because film stresses are generated due to shrinkage of the electrode films 112 when the electrode films 112 are embedded as shown in FIG. 4F, the inclinations of the columnar patterns 151 in the area B are generated. As shown in FIGS. 4E and 4F, as the number of layers of the electrode film 112 in contact therewith is smaller, or, as the surface area in contact with the first planarization film 131 is larger, the columnar patterns 151 come to have a larger inclination angle.

Figure 4G:
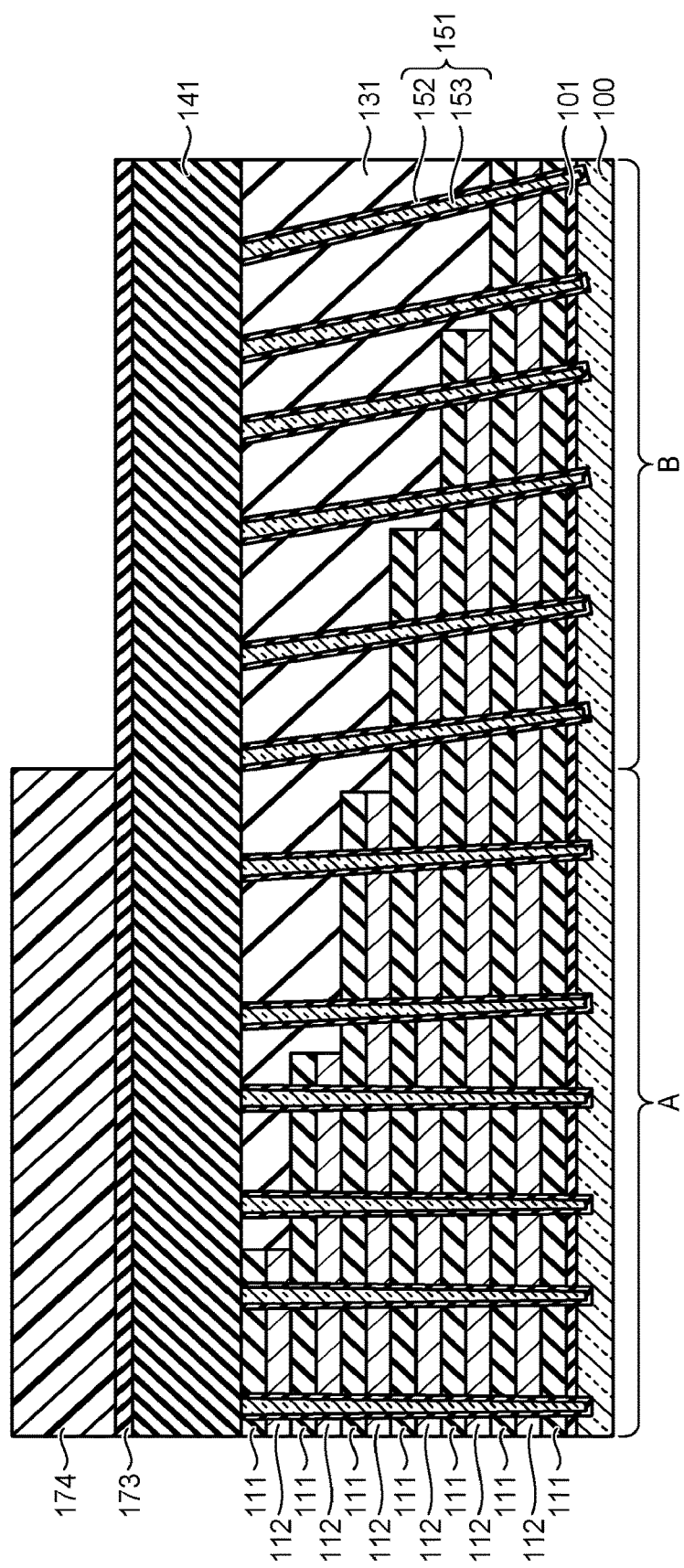

Thereafter, as shown in FIG. 4G, a stopper film 173 is formed on the interlayer insulating film 141. The stopper film 173 is preferably formed of a dense film, such as a silicon nitride film, which can provide a selective ratio relative to a silicon oxide film. This stopper film 173 will be utilized when the film part present above the stopper film 173 is subjected to a removal and planarization process in a subsequent step.

Further, a resist is applied onto the stopper film 173, and a resist pattern 174 having a predetermined shape is formed by use of a lithography technique. The resist pattern 174 includes an opening corresponding to an area including columnar patterns 151 inclined by an angle equal to or larger than a predetermined angle. In this example, the resist pattern 174 is formed with an opening corresponding to the area B.

The opening formation area is determined by observing a semiconductor device obtained by the process of manufacturing the semiconductor device, by use of an SEM (Scanning Electron Microscope). More specifically, from the state shown in FIG. 4F, the interlayer insulating film 141 is partly removed such that the upper surface portion of the first planarization film 131 in the word line contact part 20 is exposed, and the SEM is used to observe a state where the columnar patterns 151 are exposed. Then, the opening formation area is determined in accordance with an area including columnar patterns 151 such that the upper side positional shift of each of the columnar patterns 151 has a degree exceeding a predetermined range. It suffices to perform this SEM observation to only one or several ones of the semiconductor devices to be manufactured, for example. This is because the inclinations of columnar patterns 151 show the same trend even among different individuals, as long as they are manufactured on the same semiconductor substrate 100 by use of the same materials and the same steps.

Alternatively, the opening formation area may be determined by performing an simulation by use of a computer, in terms of the degree of an upper side positional shift caused by the inclination of each of the columnar patterns 151 in the word line contact part 20. In this case, the inclinations of the columnar patterns 151 are calculated, in consideration of film stresses generated between the spacer films 111 and the first planarization film 131 when the sacrificial films 171 are removed as shown in FIG. 4E; stresses generated by deflection due to the intervals between adjacent columnar patterns 151; film stresses generated due to shrinkage of the electrode films 112 formed as shown in FIG. 4F; and the materials of the sacrificial films 171, the spacer films 111, and the first planarization film 131.

Figure 4H:
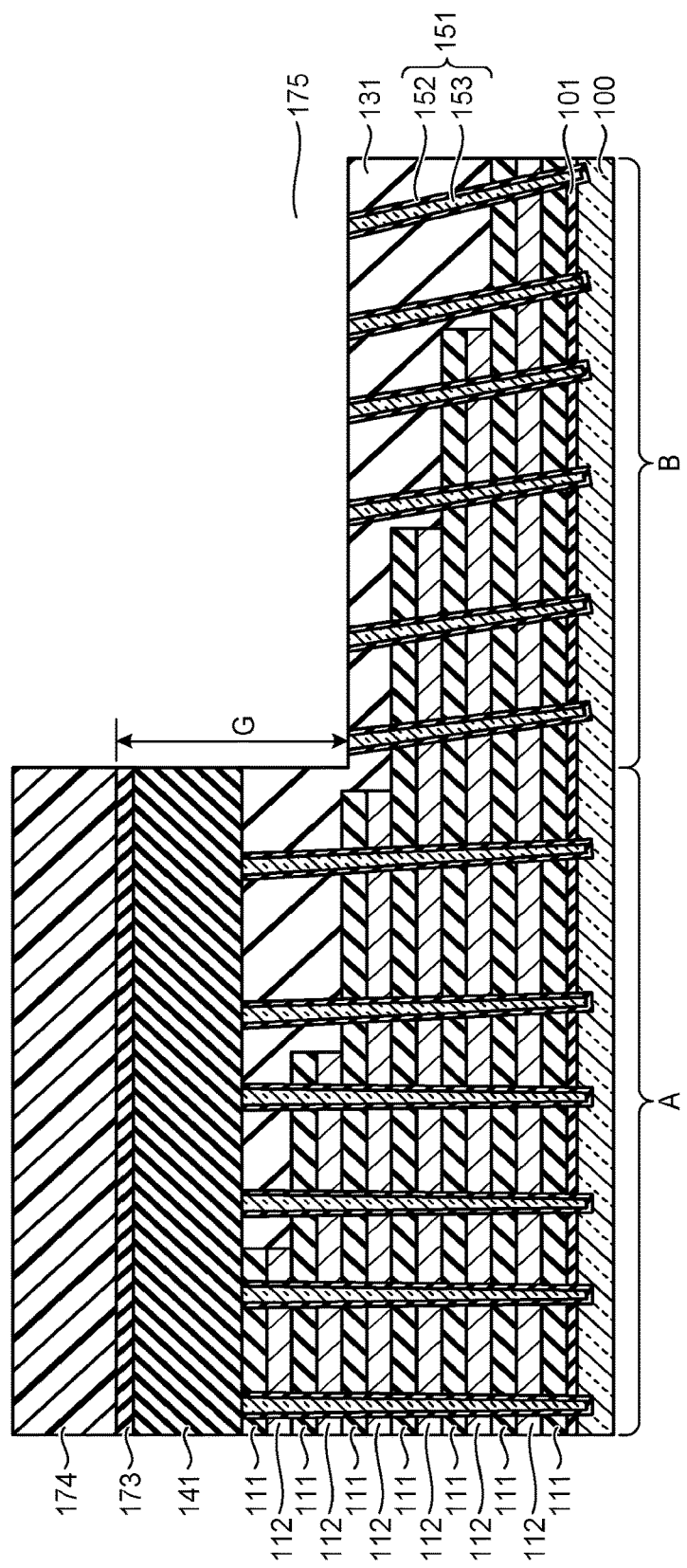

Thereafter, as shown in FIG. 4H, through the resist pattern 174 serving as a mask, the first planarization film 131 in the area B is etched to a predetermined depth. At this time, the columnar patterns 151 are partly etched together with the first planarization film 131. Consequently, a recessed portion 175 is formed such that the upper surface of the area B is set back there. FIG. 4H shows a state where the upper side of the first planarization film 131 has been etched by a depth (recessed amount) G. The resist pattern 174 is adjusted to have an opening to correspond to the area B as shown in FIG. 4G, and thereby the upper portions of the inclined columnar patterns 151 in the area B can be lowered down to the depth G as shown in FIG. 4H.

Figure 5:
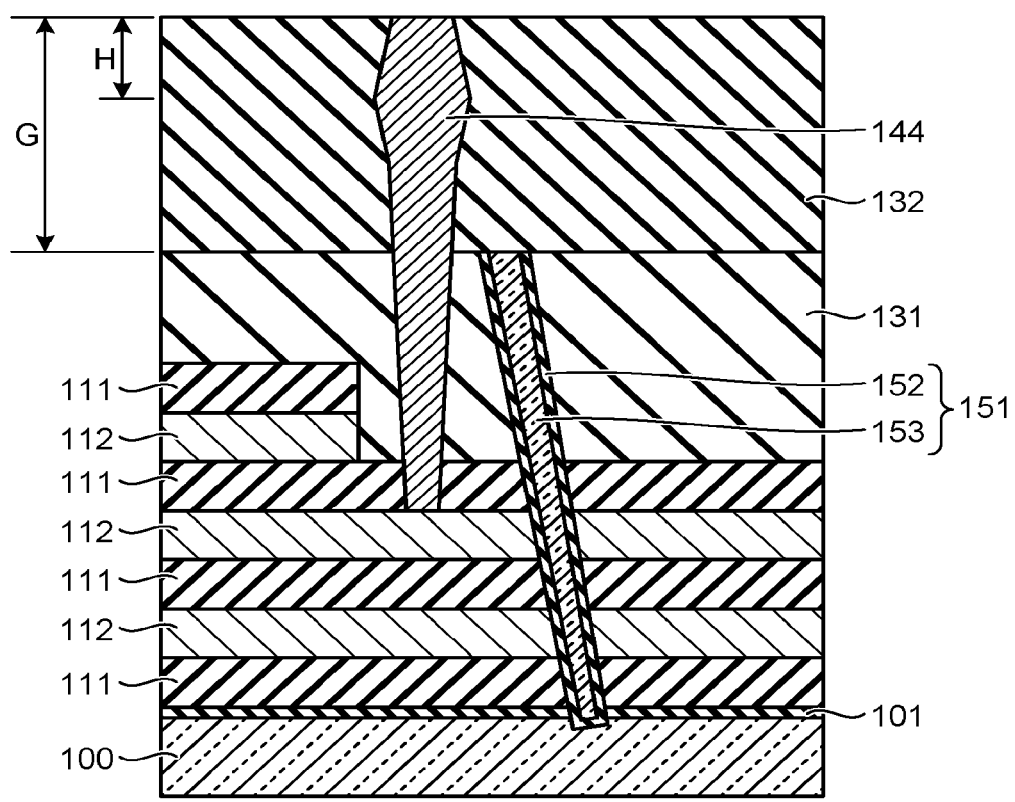
FIG. 5 is a partial sectional view schematically showing an example of the arrangement relation between a columnar pattern and a contact.

For example, the depth G is determined by observing a cross section cut along the slit at a position where each of the columnar patterns 151 is formed as shown in FIG. 4G, by use of the SEM. FIG. 5 is a partial sectional view schematically showing an example of the arrangement relation between a columnar pattern and a contact. As shown in FIG. 5, the depth G is determined such that, at the position where a contact 144 is formed in a subsequent step, the contact 144 can be connected to one of the electrode films 112 without coming into contact with the inclined columnar pattern 151. Here, it suffices to perform the determination of the depth G to only one or several ones of the semiconductor devices to be manufactured. This is because the inclinations of columnar patterns 151 show the same trend even among different individuals, as long as they are manufactured on the same semiconductor substrate 100 by use of the same materials and the same steps. Alternatively, the depth G may be determined by performing a simulation by use of a computer.

Figure 4I:
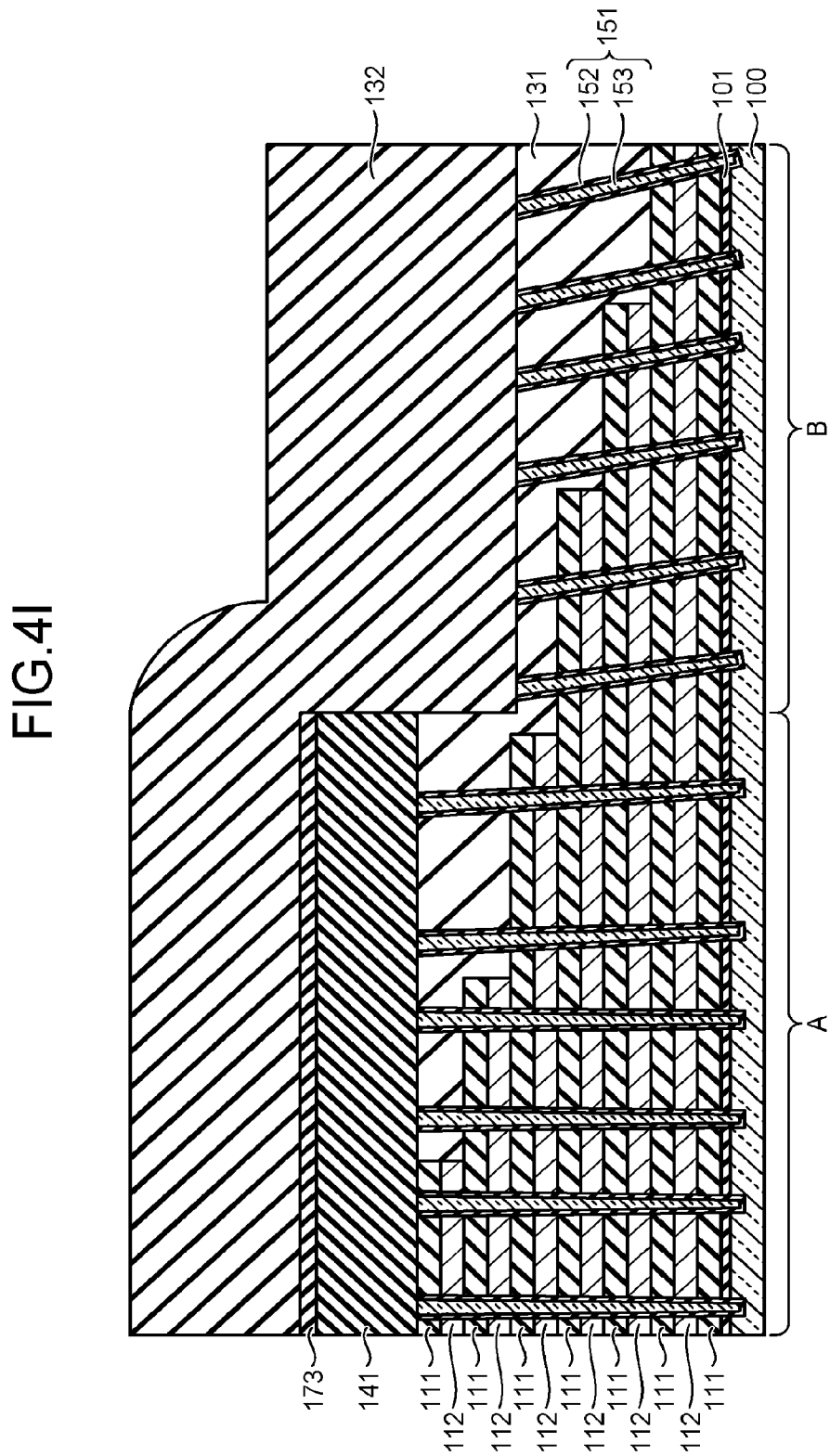

Then, as shown in FIG. 4I, a second planarization film 132 is formed on the word line contact part 20. As the second planarization film 132, for example, a silicon oxide film may be used. The thickness of the second planarization film 132 is set such that the upper surface of the second planarization film 132 in the area B is higher than the upper surface of the stopper film 173 in the area A.

Figure 4J:
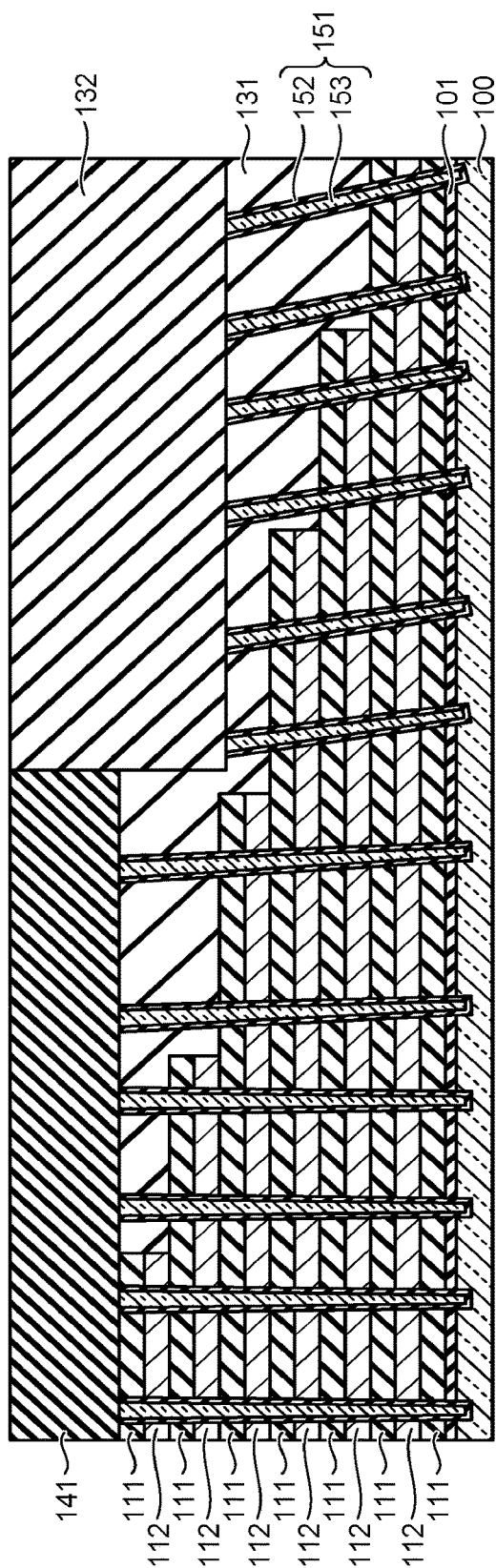

Thereafter, as shown in FIG. 4J, the part of the second planarization film 132 present above the upper surface of the stopper film 173 is removed by use of a CMP method or etching back using anisotropic etching. Further, the stopper film 173 is removed by use of a CMP method or etching back using anisotropic etching, where the interlayer insulating film 141 below the stopper film 173 serves as a stopper. Consequently, the second planarization film 132 comes into a state embedded in the recessed portion 175.

Figure 4K:
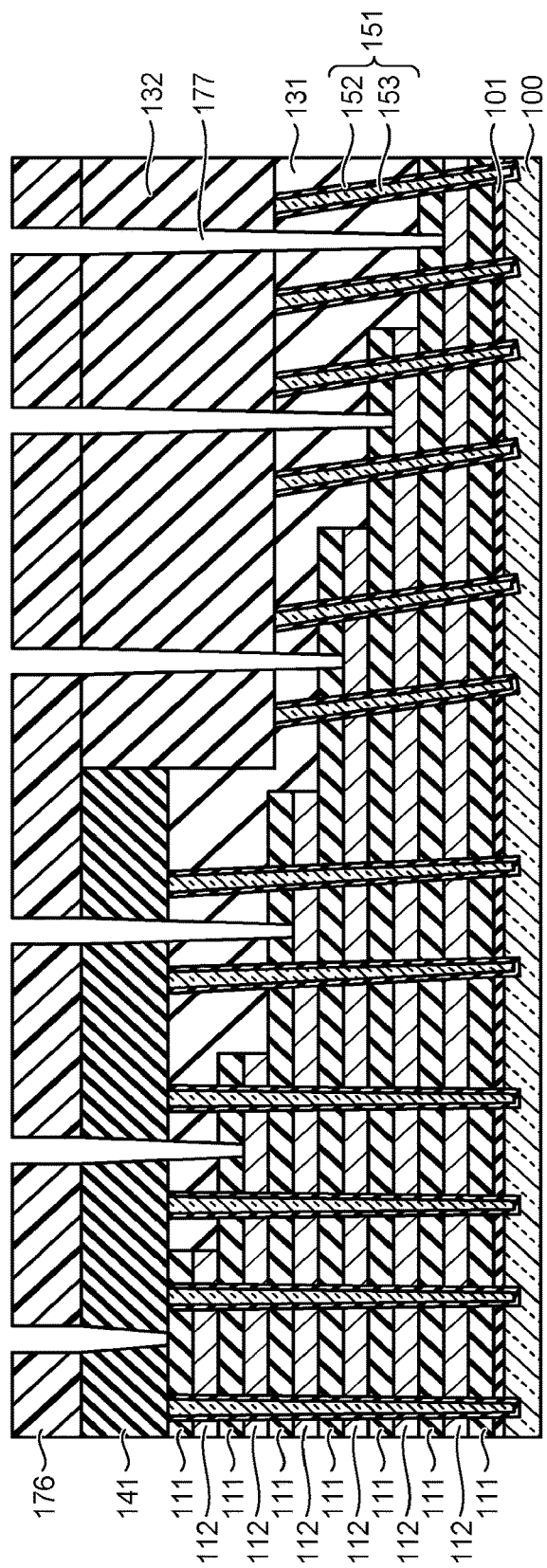

Then, as shown in FIG. 4K, a resist is applied onto the interlayer insulating film 141 and the second planarization film 132, and a resist pattern 176 is formed by use of a lithography technique such that it includes openings at contact arrangement positions. Thereafter, through the resist pattern 176 serving as a mask, the interlayer insulating film 141, the first planarization film 131, the second planarization film 132, and the spacer films 111 are etched, so that contact holes 177 are formed. The spacer films 111, the interlayer insulating film 141, the first planarization film 131, and the second planarization film 132 are etched under conditions by which the selective ratio relative to the electrode films 112 is set to be sufficiently large. In this case, when the contact holes 177 respectively reach the electrode films 112, the etching rate becomes very low at the electrode films 112. In this way, the etching is performed until one of the contact holes 177 reaches the electrode film 112 on the lowermost side.

As shown in FIG. 4K, the upper portions of the columnar patterns 151 inclined by an angle equal to or larger than a predetermined angle are lowered, and thereby the columnar patterns 151 can be prevented from coming into contact with the contact holes 177. As shown in FIG. 5, when the contact holes 177 are formed, a bowing is generated in which the hole diameter becomes larger than the desired hole diameter. Here, as regards the portion where the hole comes to have a largest diameter by the bowing, "H" is assumed to denote the position (depth) of this portion from the upper surface of the second planarization film 132. Further, "G" is assumed to denote the etching depth for forming the recessed portion 175. In order to prevent the columnar patterns 151 from coming into contact with the contact holes 177, it is preferable to satisfy the relationship expressed by the following formula (1).

$$H < G \qquad (1)$$

Thereafter, as shown in FIG. 3, a metal is embedded into the contact holes 177, and thereby contacts 144 are formed. As this metal, for example, W may be used. The contacts 144 serves as contacts for electrically connecting with word lines at respective layers to supply a voltage from a row decoder circuit. As a result, the stepwise lead-out structure as shown in FIG. 3 is formed.

Figure 6A:
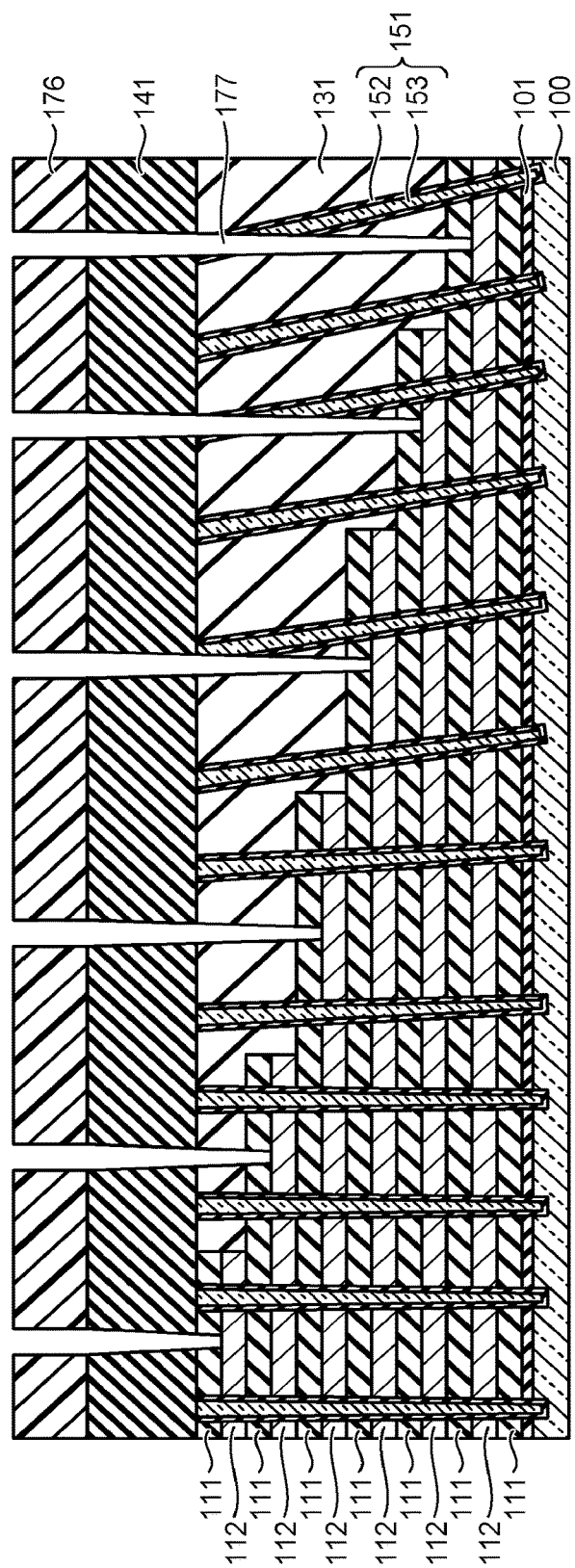

FIGS. 6A and 6B are sectional views showing an example of the sequence of a method of manufacturing a contact part according to a comparative example. Here, this sequence is partly the same as those shown in FIGS. 4A to 4F, and so will be explained about only different steps.

As shown in FIG. 4F, the electrode films 112 are formed in the gap spaces where the sacrificial films 171 were present, and then, as shown in FIG. 6A, a resist is applied onto the interlayer insulating film 141, and a resist pattern 176 is formed by use of a lithography technique such that it includes openings at contact arrangement positions. Thereafter, through the resist pattern 176 serving as a mask, the interlayer insulating film 141, the first planarization film 131, and the spacer films 111 are etched, so that contact holes 177 are formed. At this time, the spacer films 111, the interlayer insulating film 141, and the first planarization film 131 are etched under conditions by which the selective ratio relative to the electrode films 112 is set to be sufficiently large.

Then, as shown in FIG. 6B, a metal is embedded into the contact holes 177, and thereby contacts 144 are formed. As this metal, for example, W may be used.

Figure 7A:
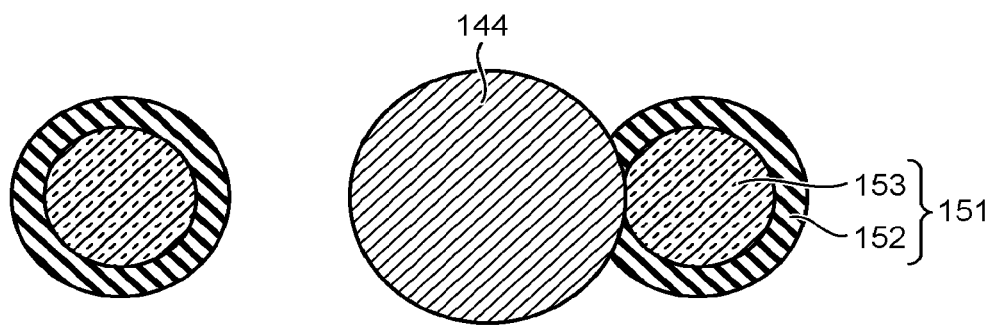
FIG. 7A is a top view schematically showing an example of the arrangement state of a columnar pattern and a contact according to the comparative example, which corresponds to a sectional view taken along a line E-E in FIG. 6B.
Figure 7B:
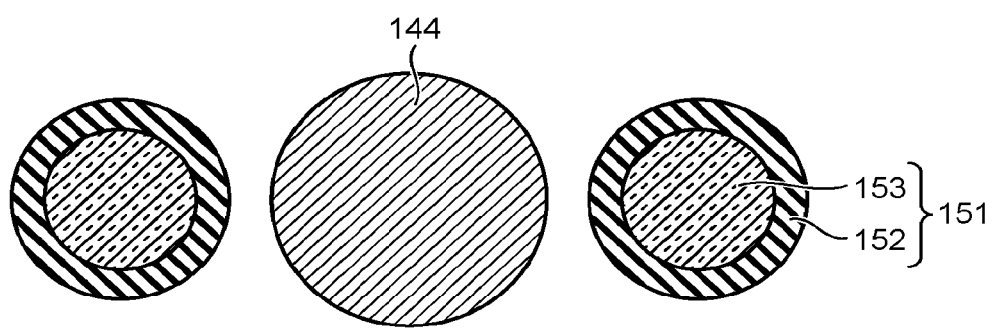
FIG. 7B is a top view schematically showing an example of the arrangement state of a columnar pattern and a contact according to the first embodiment, which corresponds to a sectional view taken along a line D-D in FIG. 3.

FIG. 7A is a top view schematically showing an example of the arrangement state of a columnar pattern and a contact according to the comparative example, which corresponds to a sectional view taken along a line E-E in FIG. 6B. FIG. 7B is a top view schematically showing an example of the arrangement state of a columnar pattern and a contact according to the first embodiment, which corresponds to a sectional view taken along a line D-D in FIG. 3.

As shown in FIGS. 6B and 7A, in the area B according to the comparative example, a contact 144 ends up in contact with an inclined columnar pattern 151. As shown in FIGS. 6B and 7A, the columnar pattern 151 has a configuration such that the outer periphery of the columnar semiconductor film 153 is covered with the insulating film 152. Accordingly, if the semiconductor film 153 inside the columnar pattern 151 and the contact 144 end up in contact with each other, a leakage current flowing through the columnar pattern 151 into the silicon substrate 100 is generated.

On the other hand, according to the first embodiment, as shown in FIGS. 3 and 7B, the columnar patterns 151 are formed in the first planarization film 131 in the word line contact part 20. Further, the area including inclined columnar patterns 151 is processed to be recessed, and then the second planarization film 132 is embedded in this recessed area. Then, the contacts 144 respectively reaching the electrode films 112 are formed in the first planarization film 131 and the second planarization film 132. Since the inclined columnar patterns 151 are processed to be recessed, a space for forming a contact 144 is provided between adjacent columnar patterns 151. In other words, even in the area including the inclined columnar patterns 151, such a probability is reduced that the columnar patterns 151 and the contacts 144 end up in contact with each other. As a result, in the case that the columnar patterns 151 are formed with a conductive film, there is provided an effect capable of preventing generation of a leakage current flowing from the contacts 144 through the columnar patterns 151 into the semiconductor substrate 100.

Further, according to the first embodiment, the first planarization film 131 is formed on the stepwise lead-out structure in the word line contact part 20, and the columnar patterns 151 are formed to penetrate, from the top to the bottom, the layered body composed of the spacer films 111 and the sacrificial films 171. Thereafter, the sacrificial films 171 are replaced with the electrode films 112, and the first planarization film 131 in the area including inclined columnar patterns 151 is processed to be recessed to a predetermined depth. Then, the second planarization film 132 is embedded in this recessed area, and the contacts 144 respectively reaching the electrode films 112 are formed. Consequently, even in the area including the inclined columnar patterns 151, such a probability is reduced that the columnar patterns 151 and the contacts 144 end up in contact with each other. As a result, as compared with the comparative example, the ratio of defective products to be generated in the formed semiconductor devices is reduced, and so there is provided an effect capable of stabilizing the manufacturing yield of the semiconductor devices.

Second Embodiment

Figure 8:
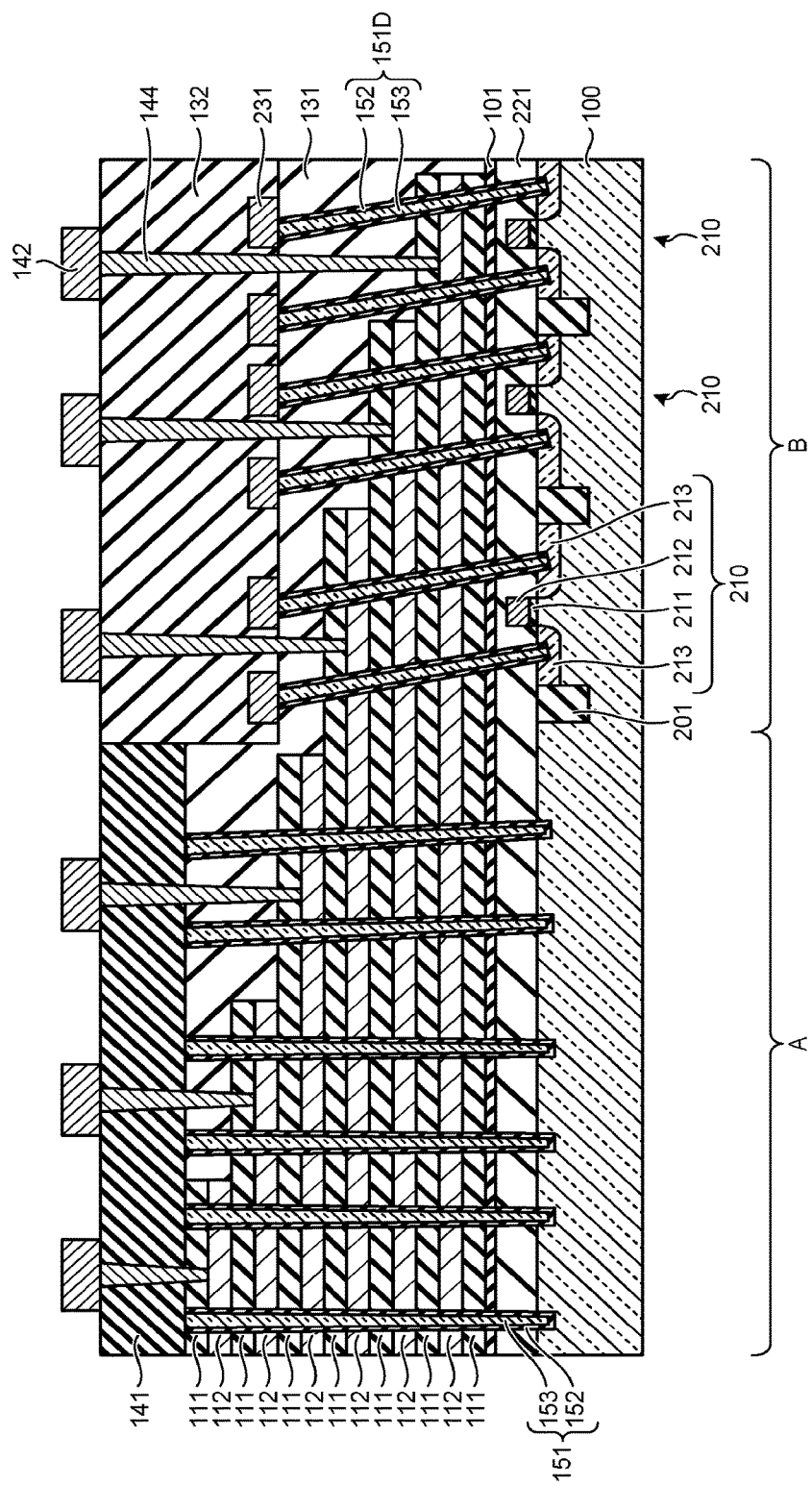
FIG. 8 is a sectional view schematically showing a structural example of a semiconductor device according to a second embodiment.

FIG. 8 is a sectional view schematically showing a structural example of a semiconductor device according to a second embodiment. On the upper surface of a semiconductor substrate 100, field effect transistors 210 are arranged. Each of the field effect transistors 210 includes a gate electrode 212 disposed through a gate insulating film 211 on the semiconductor substrate 100. Further, source/drain regions 213 of a predetermined conductive type are formed near the upper surface of the semiconductor substrate 100 at positions on the both sides of the gate electrode 212 in the gate length direction. Further, each of the field effect transistors 210 is arranged in an area demarcated by an element isolation insulating film 201.

An interlayer insulating film 221 is formed on the semiconductor substrate 100 with the field effect transistors 210 arranged thereon. On the interlayer insulating film 221, a structure similar to the word line contact part 20 as described in the first embodiment is arranged. However, columnar patterns 151D in the area B are arranged so that they can serve as contacts. In the example shown in FIG. 8, the lower ends of semiconductor films 153 inside these columnar patterns 151D are respectively connected to the source/drain regions 213 of the field effect transistor 210. Further, the upper ends of the semiconductor film 153 inside the columnar patterns 151D are respectively connected to portions of a wiring layer 231. The wiring layer 231 is arranged on the first planarization film 131.

As described above, the columnar patterns 151D are each composed of the columnar semiconductor film 153 and the insulating film 152 covering the outer periphery of the semiconductor film 153, and so they are prevented from being short-circuited with the electrode films 112 at the positions where the columnar patterns 151D are formed.

Here, a method of manufacturing the semiconductor device according to the second embodiment is the same as that described in the first embodiment, and so its detailed description will be suitably omitted. However, a formation method of the columnar patterns 151D is different from the case that is described in the first embodiment. After an insulating film 152 having a hollow columnar shape is formed on the sidewall of each of the columnar pattern formation holes 150, the insulating film 152 on the bottom of each of the columnar pattern formation holes 150 in the area B is removed by etching back using anisotropic etching. Subsequently, a semiconductor film 153 is formed at the center of each of the columnar pattern formation holes 150. Further, the second embodiment can provide the same effects as the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an electrode lead-out part arranged such that an electrode film and a first insulating film are alternately stacked in a plurality of layers above a substrate, layers of the electrode film being arranged stepwise to be longer gradually toward a lower side;
   a planarization film including a second insulating film and arranged above the electrode lead-out part;
   contacts made of a conductive material and extending from an upper side of the planarization film to the layers of the electrode film, respectively; and
   a plurality of columnar patterns arranged in the electrode lead-out part,
   wherein the plurality of columnar patterns include
      a first columnar pattern extending from a lowermost portion of the electrode lead-out part to a position lower than the upper side of the planarization film by a first depth, and
      a second columnar pattern extending from a lowermost portion of the electrode lead-out part to a position lower than the upper side of the planarization film by a second depth larger than the first depth.

2. The semiconductor device according to claim 1, wherein the second columnar pattern is inclined.

3. The semiconductor device according to claim 1, wherein the second depth is larger than a third depth at which the contacts have a largest diameter.

4. The semiconductor device according to claim 1, wherein one of the columnar patterns is composed of a columnar semiconductor layer and a third insulating film formed on an outer periphery of the columnar semiconductor layer.

5. The semiconductor device according to claim 1, wherein the columnar patterns have a larger inclination angle, as a number of layers of the electrode film in contact therewith is smaller.

6. The semiconductor device according to claim 1, further comprising a memory cell part including memory cells arranged in a three-dimensional state and connected to the layers of the electrode film, the memory cell part being arranged adjacent to the electrode lead-out part.

7. The semiconductor device according to claim 6, wherein the memory cell part includes
- a layered body that the electrode film and the first insulating film are alternately stacked in a plurality of layers, and
- a pillar member extending through the layered body from an upper surface to a lower surface, the pillar member including an inter-electrode insulating film, a charge accumulation film, a tunnel insulating film, and a channel semiconductor film, from a side in contact with the layered body.

8. The semiconductor device according to claim 4, wherein the third insulating film is made of a material containing any one element of oxygen O, nitrogen N, and aluminum Al.

9. The semiconductor device according to claim 4, further comprising a circuit element arranged above the substrate,
- wherein an lower end of the columnar semiconductor layer of the second columnar pattern is connected to the circuit element.

10. The semiconductor device according to claim 9, further comprising a wiring layer present at a position with the second depth and connected to an upper end of the columnar semiconductor layer of the second columnar pattern.

* * * * *